United States Patent [19]
Hill et al.

[11] Patent Number: 5,787,041
[45] Date of Patent: Jul. 28, 1998

[54] SYSTEM AND METHOD FOR IMPROVING A RANDOM ACCESS MEMORY (RAM)

[75] Inventors: J. Michael Hill; Donald R. Weiss, both of Fort Collins, Colo.

[73] Assignee: Hewlett-Packard Co., Palo Alto, Calif.

[21] Appl. No.: 724,204

[22] Filed: Oct. 1, 1996

[51] Int. Cl.$^6$ .................................................. G11C 7/00
[52] U.S. Cl. ........................... 365/189.02; 365/230.02; 365/230.03; 365/205; 365/189.05
[58] Field of Search .................. 365/189.02, 230.02, 365/230.03, 63, 51, 205, 184.05

[56] References Cited

U.S. PATENT DOCUMENTS

| | | | |
|---|---|---|---|
| 5,245,585 | 9/1993 | Voss et al. | 365/230.02 X |
| 5,313,431 | 5/1994 | Uruma et al. | 365/205 X |
| 5,379,248 | 1/1995 | Wada et al. | 365/63 |
| 5,390,139 | 2/1995 | Smith et al. | 365/230.03 X |
| 5,621,695 | 4/1997 | Tran | 365/230.03 |

FOREIGN PATENT DOCUMENTS 2-123594  5/1990  Japan.

Primary Examiner—David C. Nelms
Assistant Examiner—Huan Hoang

[57] ABSTRACT

An improved random access memory (RAM) system enhances the speed and reduces power dissipation and logic complexity associated with a RAM. The RAM system includes first and second pluralities of RAM cell columns. Each of the columns includes (1) at least one RAM cell, each RAM cell configured to read and write a respective logic state and (2) bit and nbit connections (differential and complimentary) connected to each of the RAM cells. A first multiplexer is designed to multiplex the bit and nbit connections of the first plurality of RAM cell columns. A second multiplexer is configured to multiplex the bit and nbit connections of the second plurality of columns. Decode logic controls the first and second multiplexers, and the decode logic accesses a particular column and cell in one of the first and second pluralities during each memory access. A sense amplifier is configured to read the bit and nbit connections of the first and second pluralities via respectively the first and second multiplexers. The sense amplifier is designed to output a logic state from any of the cells based upon a voltage differential and a polarity between the bit and nbit connections of any of the columns. A write driver is configured to write the bit and nbit connections of the first and second plurality via respectively the first and second multiplexers. The write driver drives a logic state onto any of the cells based upon the voltage differential and the polarity between the bit and nbit connections of any of the columns.

17 Claims, 3 Drawing Sheets

(INVENTION)

SYSTEM AND METHOD FOR IMPROVING A RANDOM ACCESS MEMORY (RAM)

FIELD OF THE INVENTION

The present invention generally relates to memory management and storage in a computer or other system that uses random access memory (RAM), and more particularly, to a system and method for enhancing speed and reducing power dissipation and logic complexity in a RAM.

BACKGROUND OF THE INVENTION

A typical random access memory (RAM; e.g., static RAM (SRAM) or dynamic RAM (DRAM)) system for a computer includes an array with one or more columns of RAM cells configured to store respective logic states, i.e., either a logic high (logical "1") or a logic low (logical "0"). Data is written to and/or read from each of the RAM cells in each column via differential complimentary bit and nbit connections. An address word line, which is decoded from a computer address sent by a central processing unit (CPU) or other processor, is communicated to the RAM cells. The address word line particularly identifies and enables a specific RAM cell during each reading and writing operation.

A write driver is designed to write data to a specific RAM cell that is identified by an address word line. The bit and nbit connections are initially precharged. In order to write a logic state to a particular RAM cell, the write driver discharges one of the bit and nbit connections while maintaining the state of the other, in order to create a voltage differential between the connections and instill a particular logic state in the RAM cell.

A sense amplifier is utilized to retrieve data from RAM cells. The sense amplifier is typically a differential amplifier. It receives the differential complimentary signals on the bit and nbit connections and can read the stored logic state based upon the voltage differential and polarity between the connections. The sense amplifier produces a data output when prompted to do so by a strobe control signal. The strobe control signal can be a clock edge generated by some type of a timing control unit.

The bit and nbit signals propagate vertically through each column of RAM cells either from the write driver or to the sense amplifier. A problem with this approach includes increased capacitance load on the bit and nbit connections as the RAM array is made larger. This increased capacitance slows the RAM system and results in undesirable power consumption.

More specifically, as the number of RAM cells is increased, the slew rate, or rate of voltage change, of the bit and nbit connections becomes slower and therefore the responsiveness of the system also becomes slower. The slew rate is directly proportional to the capacitance on the bit and nbit connections. Each new RAM cell adds more capacitance and slows the bit and nbit connections. As a result, the overall performance of the RAM system is reduced with an increase in the number of RAM cells.

Moreover, the power dissipated by the bit and nbit connections can be expressed mathematically in simple terms as follows: $P \alpha V^2 * C$, where P is dissipated power, V is voltage, and C is capacitance. Accordingly, the dissipated power P is directly proportional to the capacitance C on the bit and nbit connections, and increased capacitance C results in increased power dissipation, particularly during write cycles which drives the voltage on the bit and nbit connections from the high voltage rail $V_{DD}$ to ground.

In order to improve the performance of the RAM system relative to speed, some designers have divided the RAM cells into banks, each bank having a sense amplifier and a write driver at the bottom of each bank. The banks are then merged through one or more levels of multiplexers. Although meritorious to an extent, this approach suffers from undesirable logic complexity, increased power consumption, and only a modest increase in speed. Thus, a heretofore unaddressed need exists in the industry for an improved RAM system.

SUMMARY OF THE INVENTION

An object of the invention is to overcome the deficiencies and inadequacies of the prior art, as described previously in the background section. Briefly described, the present invention provides for system and method for enhancing speed and reducing power dissipation and logic complexity in a random access memory (RAM).

With respect to architecture, the system is implemented as follows. The system includes first and second pluralities of RAM cell columns. Each of the columns includes (1) at least one RAM cell, each RAM cell configured to read and write a respective logic state and (2) bit and nbit connections (differential and complimentary connections) connected to each of the RAM cells. A first multiplexer is designed to multiplex the bit and nbit connections of the first plurality of memory cell columns. A second multiplexer is configured to multiplex the bit and nbit connections of the second plurality of RAM cell columns. Decode logic controls the first and second multiplexers, and the decode logic accesses a particular column and cell in one of the first or second pluralities during each memory access. A sense amplifier is configured to read the bit and nbit connections of the first and second pluralities via respectively the first and second multiplexers. The sense amplifier is designed to output a logic state from any of the RAM cells based upon a voltage differential and a polarity between the bit and nbit connections associated with a column that is currently in communication with the write driver. A write driver is configured to write the bit and nbit connections of the first and second plurality via respectively the first and second multiplexers. The write driver drives a logic state onto any of the RAM cells based upon the voltage differential and the polarity between the bit and nbit connections of any of the columns. As is apparent from the aforementioned configuration, the invention splits the bit and nbit connections in half and places the sense amplifier and write driver in the center of the RAM array.

In a possible embodiment of the RAM cells, each of the RAM cells comprises the following. First and second inverters have first and second inputs respectively and have first and second outputs respectively. The first output is connected to the second input, and the second output is connected to the first input. A first pass transistor connects the bit connection with the first input. A second pass transistor connects the nbit connection with the second input. With the forgoing configuration, an overall logic state is stored based upon differential logic states at the first and second inputs.

The invention can also be conceptualized as providing a method for enhancing speed and reducing power dissipation and logic complexity in random access memory. The method can be broadly summarized as follows: providing first and second pluralities of RAM cell columns, each of the columns including at least one RAM cell, each the RAM cell configured to read and write a respective logic state; multiplexing access to the first and second pluralities to enable reading and writing operations relative to the RAM cells; and accessing a particular column and cell in one of the first and second pluralities during each memory access.

The invention has numerous advantages, a few of which are delineated hereafter, as merely examples.

An advantage of the invention is that it improves the speed of RAM designs.

Another advantage of the invention is that it minimizes the logic required for implementation of a RAM, particularly, only one write driver and only one sense amplifier are required, and thus, the invention reduces the overall requisite size of the RAM.

Another advantage of the invention is that it reduces power dissipation associated with a RAM.

Another advantage of the invention is that it is simple in design, reliable in operation, and easily implemented in mass production.

Other objects, features, and advantages of the present invention will become apparent to one with skill in the art upon examination of the following drawings and detailed description. It is intended that all such additional objects, features, and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating principles of the present invention. In the drawings, like reference numerals designate corresponding parts throughout the several views.

DETAILED DESCRIPTION OF THE PREFERRED EMBODIMENT

Figure 1:
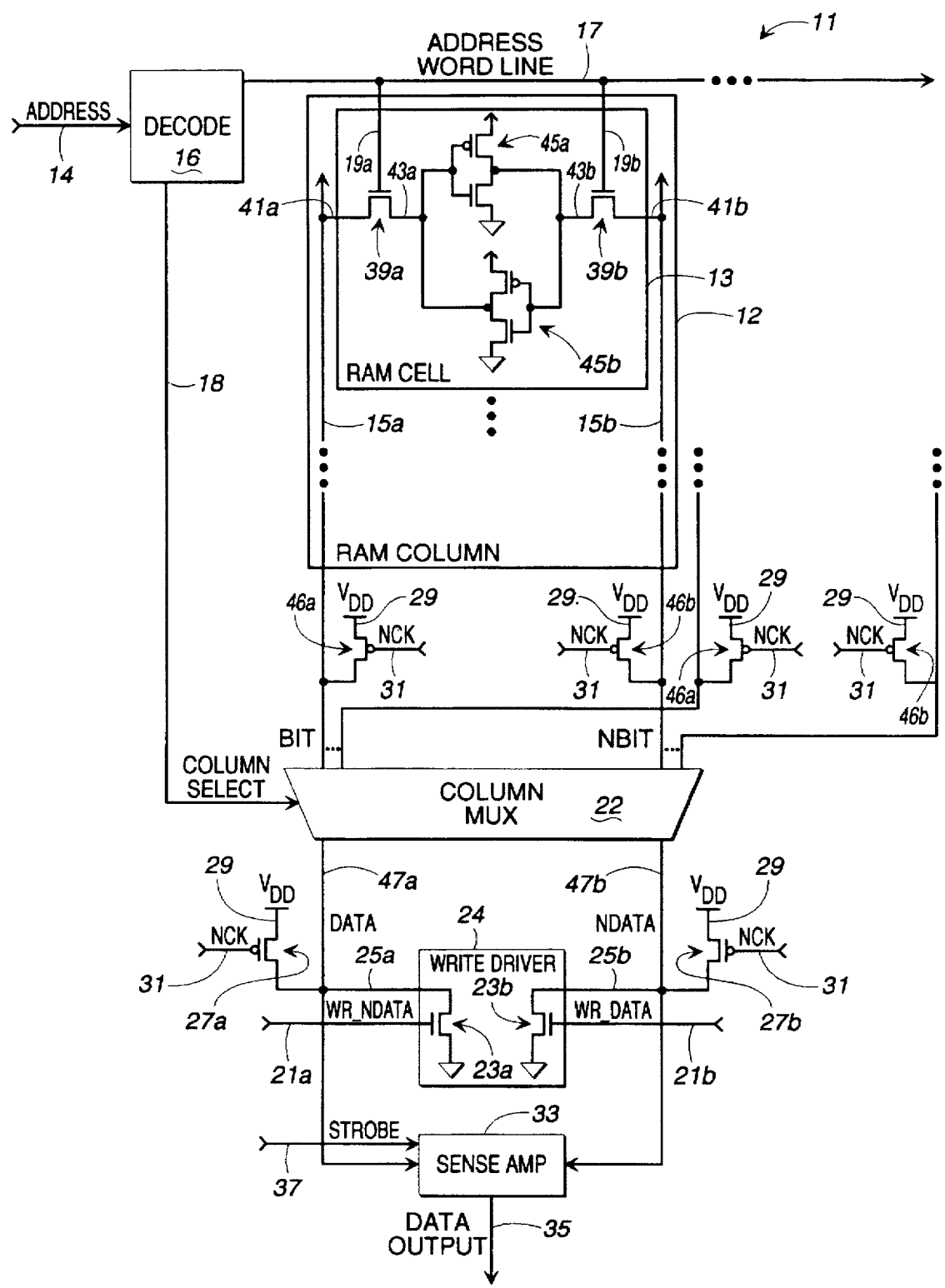
FIG. 1 is a schematic circuit diagram of a RAM system of the prior art.

A typical random access memory (RAM) system in accordance with the prior art is shown in FIG. 1 and is generally denoted by reference numeral 11. The RAM system 11 may be situated in a computer or other electronic system. The RAM system 11 includes an array, typically two dimensional, of RAM cells 13 configured to store respective logic states, i.e., either a logic high (logical "1") or a logic low (logical "0"). The RAM cells 13 are often arranged in one or more parallel columns 12 (each a one dimensional array).

Data is written to and read from each of the RAM cells 13 in each column 12 via differential complimentary bit and nbit connections 15a, 15b associated with each column 12. Cells 13 are identified for reading and writing operations via a memory address 14 sent by, for example, a central processing unit (CPU) of a computer. The address 14 is decoded by a decoder 16 into an address word line 17 and a column select 18. The former identifies a particular row in the array of the RAM system 11, whereas the latter identifies a particular column 12.

More specifically, the address word line is communicated on connection 17 to the row of RAM cells 13. The address word line on connection 17 is bit sliced via dual rail connections 19a, 19b in order to particularly identify and enable a specific row of RAM cells 13 during each reading and writing operation. Moreover, the column select is communicated to a multiplexer (MUX) 22 on connection 18. The MUX 22 is configured to select a particular column 12, i.e., a particular pair of the bit and nbit connections 15a, 15b, based upon the column select 18.

A write driver 24 is configured to receive complimentary wr__ndata 21a and wr__data 21b, typically from a CPU or other processor. The write driver 24 is designed to write the data that is represented by the combination of wr__ndata 21a and wr__data 21b to a specific RAM cell 13 that is identified by an address word line 17 and the column select 18. The write driver 24 includes a data transistor 23a (e.g., an n-type field effect transistor, or an NFET) and an ndata transistor 23b (e.g., an NFET). The respective sources 25a, 25b of the transistors 23a, 23b are connected to the data and ndata connections 47a, 47b respectively and then to the bit and nbit connections 15a, 15b, respectively through the column MUX. Further, each of these transistors 23a, 23b is actuated by signals on respective connections 21a, 21b that are passed to their respective gates.

The bit and nbit connections 15a, 15b are precharged via corresponding transistors 46a, 46b (e.g., p-type FETs, or PFETs), which are connected to the high voltage rail VDD, denoted by reference numeral 29, and which are clocked by an inverse clock (NCK) signal 31.

The data and ndata connections 47a, 47b are precharged via corresponding transistors 27a, 27b (e.g., p-type FETs, or PFETs), which are connected to the high voltage rail VDD, denoted by reference numeral 29, and which are clocked by an inverse clock (NCK) signal 31. As it is clear from the configuration in FIG. 1, the precharge transistors 27a, 27b precharge the corresponding data and ndata connections 47a, 47b, while the write driver transistors 23a, 23b discharge the same, when appropriate.

A sense amplifier 33 is utilized to retrieve data from RAM cells 13. The sense amplifier 33 is typically a differential amplifier. It receives the differential complimentary signals on the data and ndata connections 47a, 47b and can read the stored logic state from a RAM cell 13 based upon the voltage differential and polarity between the bit and nbit signals on connections 15a, 15b as transmitted through MUX 22. The sense amplifier 33 produces a data output 35 when prompted to do so by a strobe control signal 37. The strobe control signal 37 can be a clock edge generated by some type of a timing control unit (not shown for simplicity).

Each RAM cell 13 includes a pair of pass transistors 39a, 39b (e.g., NFETs). Their corresponding sources 41a, 41b are connected to the bit and nbit connections 15a, 15b. Their corresponding drains 43a, 43b are connected to an inner looped latching circuit. Their corresponding gates are connected to and actuated by respective connections 19a, 19b from the connection 17 that carries an address word line. The latching circuit includes inverters 45a, 45b, for example, complimentary metal oxide semiconductor field effect transistors (CMOSFETs), having the input of one connected to the output of the other and the output of the other connected to the input of the one.

In operation, the differential complimentary nodes 43a, 43b are driven to either logic states "01" or logic states "10", respectively. As an example, the former set of differential logic states may collectively represent a logical 1, whereas the latter set may represent a logical 0.

The sequence of events are now described with reference to the graphs in FIGS. 2A and 2B in addition to the architecture of FIG. 1. Initially, the bit and nbit connections 15a, 15b are precharged via respective transistors 46a, 46b. Next, the address word line 17 and the column select 18 are communicated to the array of RAM cells 13 from, for example, the CPU. At this point, either the write driver 24 writes data to the RAM cells 13 or the sense amplifier 33 reads data from the RAM cells 13.

During a write operation, the write driver 24 causes one of the following: (a) the data connection 47a and bit connection 15a (through the column MUX 22) are maintained at a logic high, while the ndata connection 47b and nbit connection 15b (through the column MUX 22) are driven to a logic low from a logic high, or alternatively, (b) the data connections 47a and bit connection 15a (through the column MUX 22) is driven to a logic low from a logic high, while the data connection ndata and nbit connection 15b (through the column MUX 22) are maintained at a logic high. The former scenario causes the accessed cell 13 to store one logic state, such as a logic high, while the latter scenario causes the accessed cell 13 to store another logic state, such as a logic low.

During a read operation, the sense amplifier 33 senses the bit and nbit connections 15a, 15b. One of the two possible signal configurations should exist: (a) the bit connection 15a is at a logic high, while the nbit connection 15b is at a logic low, or alternatively (b) the bit connection 15a is at a logic low, while the nbit connection 15b is at a logic high. The logic levels from the bit and nbit connections, 15a, 15b respectively are transferred to the data and ndata connections, 47a, 47b connections respectively through the column MUX 22. The former scenario causes the sense amplifier 33 to conclude that the accessed cell 13 is at one logic state, such as a logic high, while the latter scenario causes the sense amplifier 33 to conclude that the accessed cell 13 is at another logic state, such as a logic low.

Figure 2A:
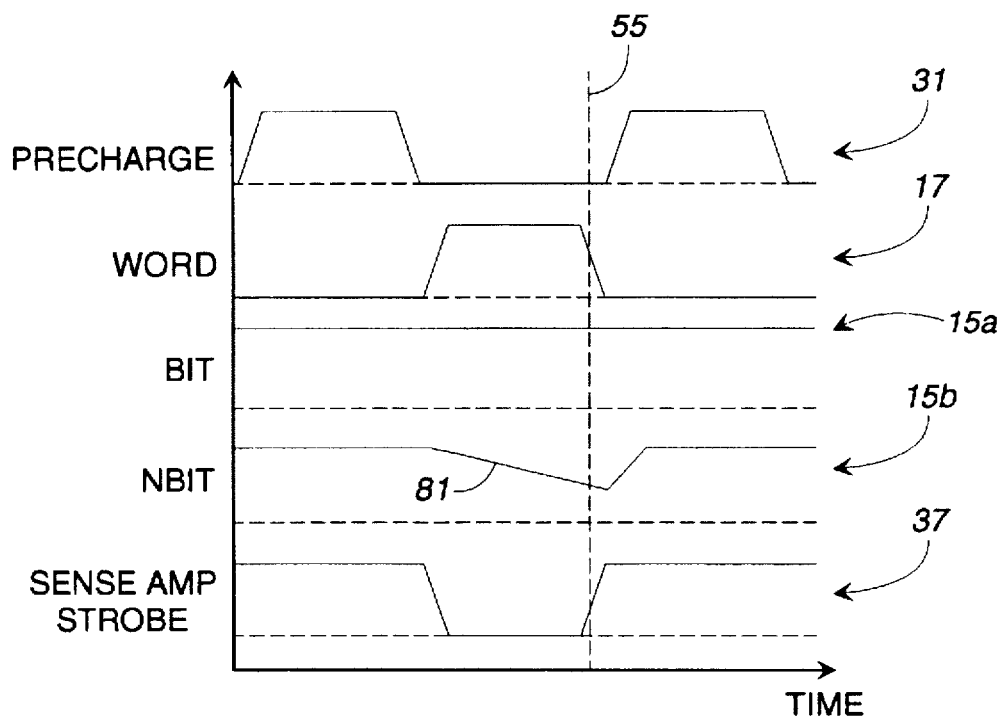
FIGS. 2A and 2B are graphical timing diagrams that show the slew rate of nbit connections in the RAM system of FIG. 1 and the RAM system of the invention, respectively, in order to illustrate an improvement in performance in the latter system.

For purposes of simplicity and illustration, FIG. 2A shows a read operation, where the nbit connection 15b is driven to a logic low, while the bit connection 15a is maintained at a logic high, by the accessed cell 13. As the nbit connection transcends from high voltage, the strobe control signal 37 is triggered at a point when the nbit signal establishes a sufficient disparity between the bit and nbit signals. Phantom line 55 indicates the point when the strobe control signal 37 is asserted. In a specific example of a possible embodiment, $V_{DD}$ is about 3.3 volts (v) and the strobe control signal 37 is triggered when the nbit signal differs from $V_{DD}$ by about 100 millivolts (mv) to 1 v.

When the bit signal 15a is maintained at a logic high, while the nbit signal 15b is driven to logic low, the nodes 43a, 43b of FIG. 1 will be forced to exhibit "10". Furthermore, the sense amplifier 33 can read the states of the nodes 43a, 43b, and drive an appropriate logical state 35 when prompted to do so by the strobe control signal 37.

As a result of the configuration of FIG. 1, the bit and nbit signals 15a, 15b propagate vertically through the column 12 of RAM cell 13 either from the write driver 24 or to the sense amplifier 33. A problem with this approach includes increased capacitance load on the bit and nbit connections 15a, 15b as the RAM array is made larger. This increased capacitance slows the RAM system 11 and results in undesirable power consumption.

More specifically, as the number of RAM cell 13 is increased, the slew rate, or rate of voltage change, of the connections 15a, 15b becomes slower and therefore the responsiveness of the system also becomes slower. The slew rate is directly proportional to the capacitance on the connections 15a, 15b. Each new RAM cell 13 adds more capacitances and slows the bit and nbit connections 15a, 15b. As a result, the overall performance of the RAM system 13 is increasingly reduced with an increase in the number of RAM cells 13.

Moreover, the power dissipated by the bit and nbit connections 15a, 15b can be expressed mathematically as follows: $P\alpha V^2 *C$, where P is dissipated power, V is voltage, and C is capacitance. Accordingly, the dissipated power P is directly proportional to the capacitance C on the connections 15a, 15b and increased capacitance C results in increased power dissipation, particularly during write cycles wherein the voltage on one of the bit and nbit connections is driven from high voltage $V_{DD}$ to ground.

In order to improve the performance of the RAM system 11 relative to speed, some designers have divided the RAM cells 13 into banks, each bank having a sense amplifier 33 and a write driver 24 at the bottom of each bank. The banks are then merged through one or more levels of multiplexers. Although meritorious to an extent, this approach suffers from undesirable logic complexity, increased power consumption, and only a modest increase in speed. Thus, a heretofore unaddressed need exists in the industry for an improved RAM system.

Figure 3:
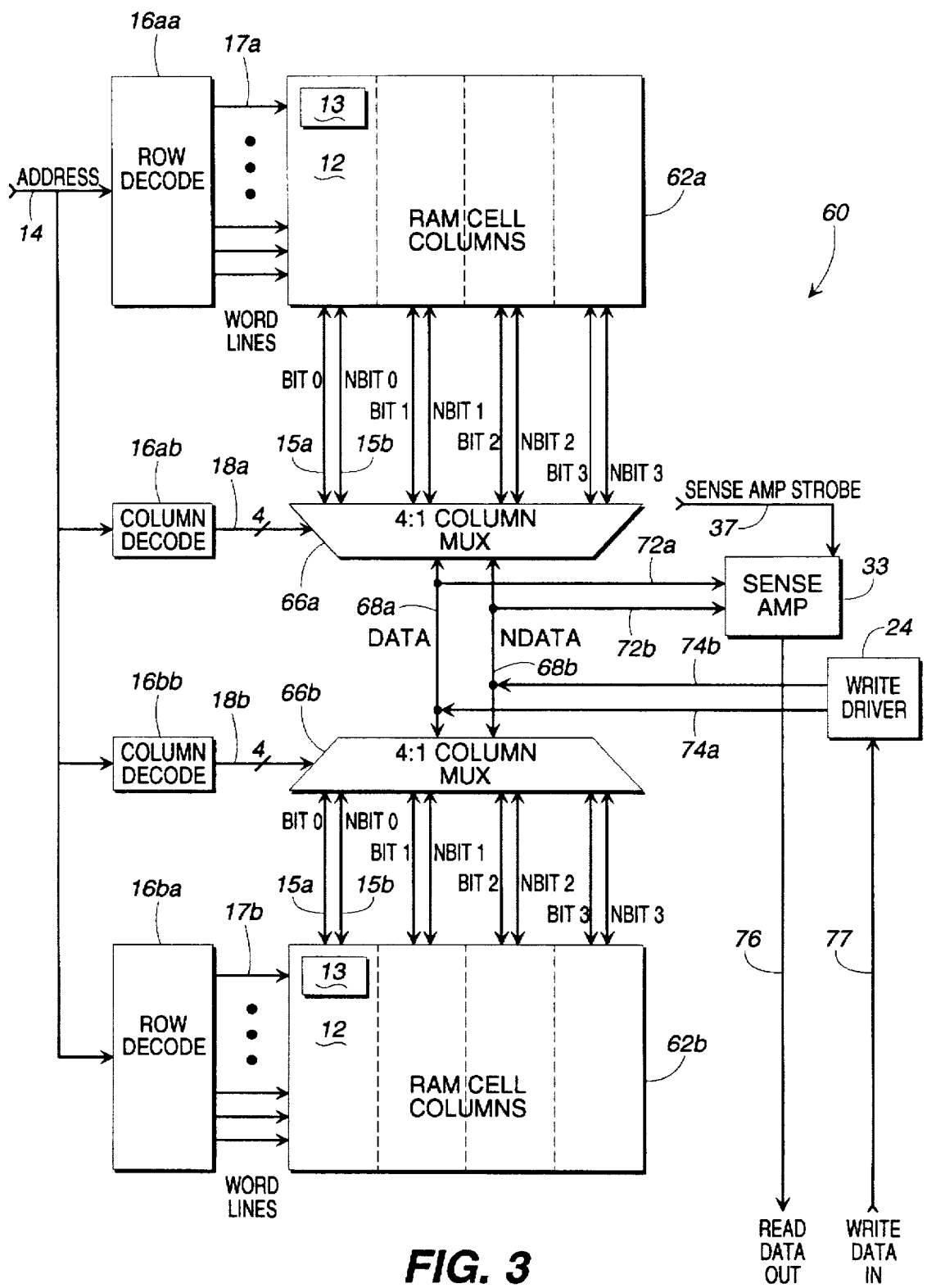
FIG. 3 is a schematic circuit diagram of the RAM system of the invention.

FIG. 3 is a systematic circuit diagram showing the random access memory (RAM) system 60 in accordance with the present invention. As it is apparent from the architecture in FIG. 3, the invention splits the bit and nbit connections 15a, 15b in half and places the sense amplifier 33 and write driver 24 in the center of the RAM array.

The RAM system 60 includes first and second pluralities 62a, 62b of memory cell columns 12. For purposes of illustration, each of the pluralities 62a, 62b are shown as having 4 of columns 12. Each column 12 includes one or more RAM cells 13. In the best presently known mode for practicing the invention, the pluralities 62a, 62b include 2 to 16 of columns 12 with each column 12 including 128 to 512 of RAM cells 13.

Each RAM cell 13 is configured to store a respective logic state, i.e., either a logical one or a logical zero. The RAM cells 13 may be constructed as described previously and as illustrated in FIG. 1.

Logic is configured to multiplex access to the first and second pluralities 62a, 62b of RAM cell columns 12 to enable reading and writing operations relative to the RAM cells 13. In this regard, a first multiplexer 66a, for example, a four-to-one multiplexer, is configured to multiplex differential pairs (e.g., bit 3, nbit 3; bit 2, nbit 2; bit 1, nbit 1; bit 0, nbit 0) of bit and nbit connections 15a, 15b between the first plurality 62a and both the sense amplifier 33 and the write driver 24. A second multiplexer 66b, for example, a four-to-one multiplexer, is configured to multiplex differential pairs (e.g., bit 3, nbit 3; bit 2, nbit 2; bit 1, nbit 1; bit 0, nbit 0) of bit and nbit connections 15a, 15b between the second plurality 62b and both the sense amplifier 33 and the write driver 24.

Data is written to and read from each of the RAM cells 13 in each column 12 via the differential complimentary bit and nbit connections 15a, 15b associated with each column 12. Cells 13 are identified for reading and writing operations via the memory address 14 sent by, for example, a central processing unit (CPU) of a computer. The address 14 is decoded by a decoder 16 that is generally comprised of a row decoder 16aa, a column decoder 16ab, a row decoder 16ba, and a column decoder 16bb. The row decoder 16aa and the column decoder 16ab are allocated to the first plurality 62a of columns 12, while the row decoder 16ba and the column decoder 16bb are allocated to the second plurality 62b of columns 12. The address is decoded into an address word line 17 and a column select 18. The row decoder 16aa decodes the address 14 into address word lines 17a that are passed to respective rows of cells 13 of the first plurality 62a. Moreover, the column decoder 16ab produces a column select 18a based upon the address 14 for controlling the MUX 66a. Similarly, the row decoder 16ba decodes the address 14 into address word lines 17b that are passed to respective rows of cells 13 in the second plurality 62b. Moreover, the column decoder 16bb produces a column select 18b based upon the address 14 for controlling the MUX 66b.

The sense amplifier 33 is configured to read the bit and nbit connections 15a, 15b of the first and second pluralities 62a, 62b of RAM cell columns 12 via the first and second multiplexers 66a, 66b, respectively. The sense amplifier 33 is configured to output any logic state from any of the RAM cells 13 based upon a voltage differential and a polarity between the bit and nbit connections 15a, 15b, which are channeled to the sense amplifier 33 via connections as indicated by reference arrows 68a, 68b and 72a, 72b. The sense amplifier 33 is further configured to output the data, as indicated by reference arrow 76.

The write driver 24 is configured to write data to the bit and nbit connections 15a, 15b and ultimately to a particular RAM cell 13 via respectively the first and second multiplexers 66a, 66b. The write driver 24 is configured to drive any logic state onto any of the RAM cells 13 based upon the voltage differential and polarity between the bit and nbit connections 15a, 15b. The write driver 24 connects to each set of bit and nbit connections 15a, 15b via respective connections 74a, 74b and 68a, 68b. The write driver 24 receives data from a CPU or other processor, as indicated by reference arrow 77.

In operation, initially, the bit and nbit connections 15a, 15b are precharged. An address 14 is supplied by the CPU to the RAM system 60 and decoded. A word line, either 17a or 17b, is asserted in one of the pluralities, either 62a or 62b, of columns 12. Further, a column select, either 18a or 18b, is supplied to one of the MUXs, either 66a, 66b. Depending on the address 14, either the first or second column multiplexer 66a, 66b is utilized to communicate with a column 12.

The bit and nbit connections 15a, 15b of the selected column 12 are then connected to the sense amplifier 33 and/or write driver 24. Either the write driver 24 writes data to the RAM cells 13 or the sense amplifier 33 reads data from the RAM cells 13.

During a write operation, the write driver 24 causes one of the following: (a) one of the bit connections 15a (e.g., bit 3, bit 2, bit 1, or bit 0) is maintained at a logic high, while the correlative one of the nbit connections 15b (e.g., nbit 3, nbit 2, nbit 1, or nbit 0, respectively) is driven to a logic low from a logic high, or alternatively, (b) one of the bit connections 15a is driven to a logic low from a logic high, while the correlative one of the nbit connections 15b is maintained at a logic high. The former scenario causes the accessed cell 13 to store one logic state, such as a logic high, while the latter scenario causes the accessed cell 13 to store another logic state, such as a logic low.

During a read operation, the sense amplifier 33 senses the bit and nbit connections 15a, 15b. One of two possible signal configurations should exist: (a) one of the bit connections 15a (e.g., bit 3, bit 2, bit 1, or bit 0) is at a logic high, while the correlative one of the nbit connections 15b (e.g., nbit 3, nbit 2, nbit 1, or nbit 0, respectively) is at a logic low, or alternatively, (b) one of the bit connections 15a is at a logic low, while the correlative one of the nbit connections 15b is at a logic high. The former scenario causes the sense amplifier 33 to conclude that the accessed cell 13 is at one logic state, such as a logic high, while the latter scenario causes the sense amplifier 33 to conclude that the accessed cell 13 is at another logic state, such as a logic low.

Figure 2B:
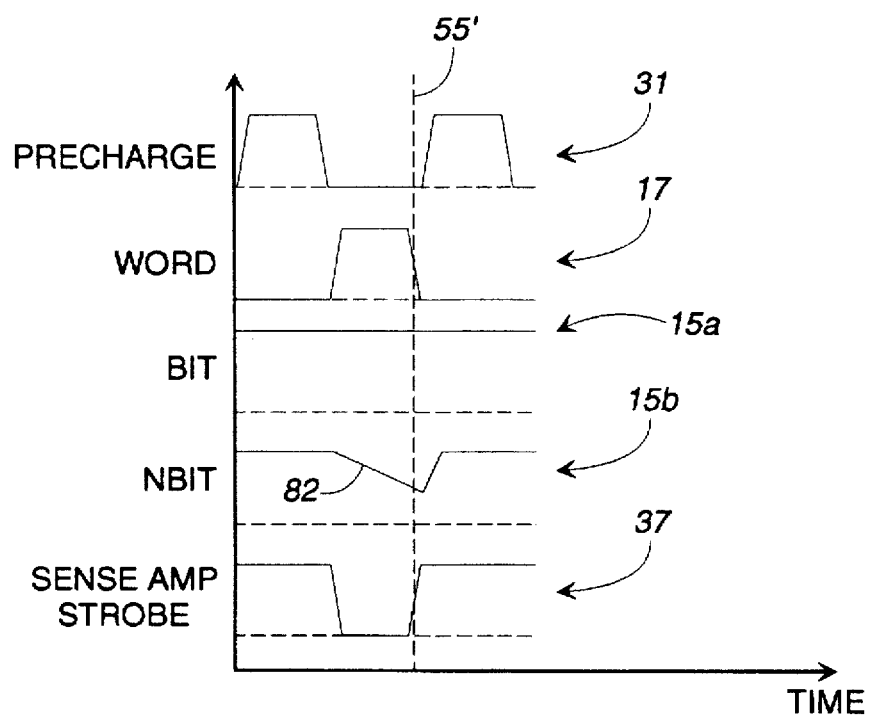

For purposes of comparison to the prior art, FIG. 2B shows a read operation, where the nbit connection 15b is driven to a logic low, while the bit connection 15a is maintained at a logic high. As the nbit connection transcends from high voltage, the strobe control signal 37 is triggered at a point when the nbit signal establishes a sufficient disparity between the bit and nbit signals. In a specific example of a possible embodiment, $V_{DD}$ is about 3.3 v and the strobe control signal 37 is triggered when the nbit signal differs from high voltage $V_{DD}$ by about 100 mv to 1v.

The sense amplifier 33 can read the differential states of the nodes 43a, 43b of the RAM cell 13, determine a logic state based upon the differential and polarity of the particular pair of bit and nbit connections 15a, 15b, and drive an appropriate logical state 35 to any other suitable system when prompted to do so by the strobe control signal 37.

The invention of FIG. 3 has several advantages, a few of which are mentioned hereafter. First, as a result of the architecture in FIG. 3, the line capacitance associated with the bit and nbit lines 15a, 15b is cut in half, thereby speeding up the operation of the RAM system 60 as compared to prior art RAM system 11. This feature is apparent by examining the slew rate of the nbit signals of the prior art and the invention, as is illustrated in FIG. 2. Referring to FIG. 2, the slope 81 of the nbit connection 15b of the prior art RAM system 11 is much less than the slope 82 of the nbit connection 15b of the RAM system 60 of the invention. Consequently, the voltage differential between the bit and nbit connections 15a, 15b is more quickly created in the RAM system 60, as compared to the prior art RAM system 11, and the strobe control signal 37 in the RAM system 60 can be asserted earlier in time at the point indicated by phantom line 55' in FIG. 2, as opposed to the point later in time indicated by phantom line 55 associated with the prior art RAM system 11.

With respect to further advantages of the RAM system 60, second, power dissipation is minimized due to a reduction in capacitance on the bit and nbit connections 15a, 15b. Third, the sense amplifier 33 and write driver 24 do not need to be duplicated in each bank, as in some prior art RAM systems, thereby reducing the size of the RAM. Fourth, no more than one level of multiplexer logic is required, further improving RAM speed.

Many variations and modifications may be made to the preferred embodiment of the invention. All such modifications and variations are intended to be included herein within the scope of the present invention, as is defined by the following claims. Furthermore, in the claims set forth hereinafter, the structures, materials, acts, and equivalents of all "means" elements and "logic" elements are intended to include any structures, materials, or acts for performing the functions specified in connection with said elements.

Wherefore, the following is claimed:

1. A system for enhancing speed and reducing power dissipation and logic complexity in random access memory, comprising:

first and second pluralities of memory cell columns, each of said columns including at least one memory cell, each said cell configured to read and write a respective logic state;

a single sense amplifier connected between said first and second pluralities of memory cell columns; and logic configured to multiplex access to said first and second pluralities to enable reading operations relative to said cells, said logic configured to access a particular column and cell in one of said first and second pluralities during each memory access.

2. The system of claim 1, further comprising:

bit and nbit connections connected to each of said cells;

a first multiplexer configured to multiplex said bit and nbit connections of said first plurality of memory cell columns;

a second multiplexer configured to multiplex said bit and nbit connections of said second plurality of memory cell columns;

said sense amplifier configured to read said bit and nbit connections of said first and second pluralities via respectively said first and second multiplexers, said sense amplifier configured to output a logic state from any of said cells based upon a voltage differential and a polarity between said bit and nbit connections of any of said columns; and a write driver configured to write said bit and nbit connections of said first and second plurality via respectively said first and second multiplexers, said write driver configured to drive a logic state onto any of said cells based upon said differential and said polarity between said bit and nbit connections of any of said columns.

3. The system of claim 2, wherein each said cell comprises:

first and second inverters having first and second inputs respectively and having first and second outputs respectively, said first output being connected to said second input, said second output being connected to said first input;

a first pass transistor connecting said bit connection with said first input; and a second pass transistor connecting said nbit connection with said second input; and whereby an overall logic state is stored based upon differential logic states at said first and second inputs.

4. A system for enhancing speed and reducing power dissipation and logic complexity in random access memory, comprising:

(a) a first plurality of memory cell columns, each of said columns including:
 (1) at least one memory cell, each said cell configured to read and write a respective logic state; and
 (2) bit and nbit connections connected to each of said cells;

(b) a second plurality of said memory cell columns;

(c) a first multiplexer configured to multiplex said bit and nbit connections of said first plurality of memory cell columns;

(d) a second multiplexer configured to multiplex said bit and nbit connections of said second plurality of memory cell columns;

(e) a single sense amplifier connected between said first multiplexer and second multiplexer, said sense amplifier configured to read said bit and nbit connections of said first and second pluralities via respectively said first and second multiplexers, said sense amplifier configured to output a logic state from any of said cells based upon a voltage differential and a polarity between said bit and nbit connections of any of said columns;

(f) a write driver configured to write said bit and nbit connections of said first and second plurality via respectively said first and second multiplexers, said write driver configured to drive a logic state onto any of said cells based upon said voltage differential and said polarity between said bit and nbit connections of any of said columns; and (g) logic configured to control said first and second mulitplexers, said logic configured to access a particular column and cell in one of said first and second pluralities during each memory access.

5. The system of claim 4, wherein each said cell comprises:

first and second inverters having first and second inputs respectively and having first and second outputs respectively, said first output being connected to said second input, said second output being connected to said first input;

a first pass transistor connecting said bit connection with said first input; and a second pass transistor connecting said nbit connection with said second input; and whereby an overall logic state is stored based upon differential logic states at said first and second inputs.

6. A method for enhancing speed and reducing power dissipation and logic complexity in random access memory, comprising the steps of:

providing first and second pluralities of memory cell columns, each of said columns including at least one memory cell, each said cell configured to read and write a respective logic state;

multiplexing access to said first and second pluralities to enable reading and writing operations relative to said cells;

providing a single sense amplifier connected between said first and second pluralities of memory cell columns; and accessing a particular column and cell in one of said first and second pluralities during each memory access.

7. The method of claim 6, further comprising the steps of:

multiplexing bit and nbit connections between said memory cell columns and said sense amplifier configured to read said bit and nbit connections of said first and second pluralities; and outputting from said sense amplifier a logic state from any of said cells based upon a voltage differential and a polarity between said bit and nbit connections of any of said columns.

8. The method of claim 6, further comprising the steps of:

multiplexing bit and nbit connections between said memory cell columns and a write driver configured to write said bit and nbit connections of said first and second pluralities; and inputting from said write driver a logic state to any of said cells based upon a voltage differential and a polarity between said bit and nbit connections.

9. A system for enhancing speed and reducing power dissipation and logic complexity in random access memory, comprising:

first and second pluralities of memory cell columns, each of said columns including at least one memory cell, each said cell configured to read and write a respective logic state;

a single write driver connected between said first and second pluralities of memory cell columns; and logic configured to multiplex access to said first and second pluralities to enable writing operations relative to said cells, said logic configured to access a particular column and cell in one of said first and second pluralities during each memory access.

10. The system of claim 9, further comprising:

bit and nbit connections connected to each of said cells;

a first multiplexer configured to multiplex said bit and nbit connections of said first plurality of memory cell columns;

a second multiplexer configured to multiplex said bit and nbit connections of said second plurality of memory cell columns;

a sense amplifier configured to read said bit and nbit connections of said first and second pluralities via respectively said first and second multiplexers, said sense amplifier configured to output a logic state from any of said cells based upon a voltage differential and a polarity between said bit and nbit connections of any of said columns; and said write driver configured to write said bit and nbit connections of said first and second plurality via respectively said first and second multiplexers, said write driver configured to drive a logic state onto any of said cells based upon said differential and said polarity between said bit and nbit connections of any of said columns.

11. The system of claim 10, wherein each said cell comprises:

first and second inverters having first and second inputs respectively and having first and second outputs respectively, said first output being connected to said second input, said second output being connected to said first input;

a first pass transistor connecting said bit connection with said first input; and a second pass transistor connecting said nbit connection with said second input; and whereby an overall logic state is stored based upon differential logic states at said first and second inputs.

12. A system for enhancing speed and reducing power dissipation and logic complexity in random access memory, comprising:

(a) a first plurality of memory cell columns, each of said columns including:

(1) at least one memory cell, each said cell configured to read and write a respective logic state; and (2) bit and nbit connections connected to each of said cells;

(b) a second plurality of said memory cell columns;

(c) a first multiplexer configured to multiplex said bit and nbit connections of said first plurality of memory cell columns;

(d) a second multiplexer configured to multiplex said bit and nbit connections of said second plurality of memory cell columns;

(e) a sense amplifier configured to read said bit and nbit connections of said first and second pluralities via respectively said first and second multiplexers, said sense amplifier configured to output a logic state from any of said cells based upon a voltage differential and a polarity between said bit and nbit connections of any of said columns;

(f) a single write driver connected between said first multiplexer and second multiplexer, said write driver configured to write said bit and nbit connections of said first and second plurality via respectively said first and second multiplexers, said write driver configured to drive a logic state onto any of said cells based upon said voltage differential and said polarity between said bit and nbit connections of any of said columns; and (g) logic configured to control said first and second mulitplexers, said logic configured to access a particular column and cell in one of said first and second pluralities during each memory access.

13. The system of claim 12, wherein each said cell comprises:

first and second inverters having first and second inputs respectively and having first and second outputs respectively, said first output being connected to said second input, said second output being connected to said first input;

a first pass transistor connecting said bit connection with said first input; and a second pass transistor connecting said nbit connection with said second input; and whereby an overall logic state is stored based upon differential logic states at said first and second inputs.

14. A method for enhancing speed and reducing power dissipation and logic complexity in random access memory, comprising the steps of:

providing first and second pluralities of memory cell columns, each of said columns including at least one memory cell, each said cell configured to read and write a respective logic state;

multiplexing access to said first and second pluralities to enable reading and writing operations relative to said cells;

providing a write driver connected between said first and second pluralities of memory cell columns; and accessing a particular column and cell in one of said first and second pluralities during each memory access.

15. The method of claim 14, further comprising the steps of:

multiplexing bit and nbit connections between said memory cell columns and a sense amplifier configured to read said bit and nbit connections of said first and second pluralities; and outputting from said sense amplifier a logic state from any of said cells based upon a voltage differential and a polarity between said bit and nbit connections of any of said columns.

16. The method of claim 14, further comprising the steps of:

multiplexing bit and nbit connections between said memory cell columns and said write driver configured to write said bit and nbit connections of said first and second pluralities; and inputting from said write driver a logic state to any of said cells based upon a voltage differential and a polarity between said bit and nbit connections.

17. A system for enhancing speed and reducing power dissipation and logic complexity in random access memory, comprising:

(a) a first plurality of memory cell columns, each of said columns including:
 (1) at least one memory cell, each said cell configured to read and write a respective logic state; and
 (2) bit and nbit connections connected to each of said cells;
(b) a second plurality of said memory cell columns;
(c) a first multiplexer configured to multiplex said bit and nbit connections of said first plurality of memory cell columns;
(d) a second multiplexer configured to multiplex said bit and nbit connections of said second plurality of memory cell columns;
(e) a single sense amplifier connected between said first multiplexer and second multiplexer, said sense amplifier configured to read said bit and nbit connections of said first and second pluralities via respectively said first and second multiplexers, said sense amplifier configured to output a logic state from any of said cells based upon a voltage differential and a polarity between said bit and nbit connections of any of said columns; and
(f) a single write driver connected between said first multiplexer and second multiplexer, said write driver configured to write said bit and nbit connections of said first and second plurality via respectively said first and second multiplexers, said write driver configured to drive a logic state onto any of said cells based upon said voltage differential and said polarity between said bit and nbit connections of any of said columns.

* * * * *